United States Patent [19]

Hill et al.

[11] Patent Number: 4,539,608
[45] Date of Patent: Sep. 3, 1985

[54] LOW OFFSET POSITION DEMODULAR

[75] Inventors: John P. Hill, Broomfield; James J. Touchton, Boulder, both of Colo.

[73] Assignee: Storage Technology Corporation, Louisville, Colo.

[21] Appl. No.: 447,823

[22] Filed: Dec. 8, 1982

[51] Int. Cl.³ .................. H03D 1/06; G11B 21/10
[52] U.S. Cl. ................................. 360/77; 318/684; 324/168
[58] Field of Search ............... 318/683, 684; 329/50, 329/131, 132, 133, 168, 169, 178, 179; 360/77, 78

[56] References Cited

U.S. PATENT DOCUMENTS

| | | | |
|---|---|---|---|
| 3,867,620 | 2/1975 | Coor | 364/819 |
| 4,059,789 | 11/1977 | Cocksedge | 318/608 |
| 4,109,189 | 8/1978 | Jacques et al. | 318/608 |
| 4,161,678 | 7/1979 | Kaieda et al. | 318/641 |
| 4,232,259 | 11/1980 | Kaieda et al. | 318/615 |
| 4,380,033 | 4/1983 | Bacrania | 360/77 |
| 4,463,317 | 7/1984 | Kusakabe | 329/103 |

*Primary Examiner*—George G. Stellar
*Attorney, Agent, or Firm*—Bryant R. Gold

[57] ABSTRACT

A low offset position demodulator that may be used in the positioning servo of a disk drive or similar device. A first stage of the demodulator circuit multiplies or switches a servo carrier signal, modulated with position information, with a synchronized gate signal. This first stage of the demodulator circuit includes a differential output and means for controlling the common mode operating point thereof with an external control voltage. A low pass filter, also having a differential output, is coupled to the differential output of the first stage of the demodulator. A differential-to-single-ended conversion stage is tied to the low pass filter output to provide a single position output signal. Also coupled to the low pass filter differential output is an averaging network that averages the signal appearing on one of the two differential signal lines with the signal appearing on the other differential signal line. The resulting averaged signal is compared to a zero voltage reference signal and the difference between these two signals is then used to derive the control voltage applied to the first stage of the modulator. Hence, the common mode operating point of the balanced demodulator is forced to assume and maintain a zero volt level.

22 Claims, 12 Drawing Figures

LOW OFFSET POSITION DEMODULAR

BACKGROUND OF THE INVENTION

The present invention relates to low offset demodulators, and more particularly to a low offset position demodulator for use in a positioning servo of a disk drive, or similar device.

It is common practice in the electromechanical arts to use a position servo to control the positioning of a first movable element with respect to a second, usually stationary, element. Such controlled motion is typically realized through the use of a suitable position transducer that senses the relative location of the first element with respect to the second element. The relative location is typically indicated by an electronic signal, derived from or generated by the transducer, that assumes a prescribed value, such as a null point, when the desired position is sensed; and assumes a value other than the prescribed value when the desired location is not sensed. The electronic signal thus derived from the transducer, typically referred to as a "position signal", is then used as the error signal for a positioning servo system. The position servo, in response to the position signal, causes the first element to move relevant to the second element until the position signal is driven to its prescribed level, indicating that the desired position has been obtained. Any errors in the position signal, such as might be caused by dc offset, translate directly to positioning errors between the first and second elements. Thus, such errors limit the accuracy of the positioning servo.

In the data processing industry, for example, it is common practice to store large quantities of data in digital form upon rotating disk storage media. In order to access a desired location, or data track, on the disk, a read/write head must be positioned radially with respect to the disk so that the desired track can be accessed. Once positioned, data may be written to or read from the tracks located on the disk. The amount of data that may be written to or read from a given disk—the data density—is in large part a function of how closely the data tracks may be placed together. The achievable track density is, in turn, largely a function of the accuracy of the positioning servo used to position the read/write head. It is thus desireable to utilize a position transducer in such disk storage schemes that generates a position signal (or that generates a signal from which a position signal may be derived) wherein a minimum amount of dc offset is present.

There are many types of disk storage systems. One type of popular disk storage system employs a plurality of rigid magnetic disks that are stacked one on top of the other on a common shaft and rotated at a steady speed. Magnetic read/write heads, one for each side of each disk, are moved in and out radially with respect to the disk in response to machine commands. All the magnetic heads are mounted on a single head drive means and move together until the head is positioned at the distance from the center of the disk where the particular record sought to be read or written is located. As explained earlier, it is desireable to provide a magnetic storage media with as much data storage capacity as possible. To this end, it is desireable to locate the tracks as close to one another as possible. This requires that dc offset present in the associated positioning signal must be eliminated or greatly minimized.

In order to define the location of data tracks on the disk to which data may be written or from which data may be read, it is common practice in such a common spindle, multiple disk drive to dedicate one surface of one of the disks to the storage of permanently encoded position information. Such position information is pre-written onto the disk, using specially designed servo writing equipment, in a plurality of servo tracks. A servo read head, tied to all the other read heads, then reads the position information as the disk pack rotates. It is from this information that the above-described position signal is derived. The positioning servo may then selectively and repeatidly lock onto and follow a given servo track or tracks are required. The servo tracks located on the servo disk thus define the location where data tracks will exist on the surface of the other disks.

In order to optimize the transfer of information from the disk surface to the read head, it is usually advantageous to employ a carrier signal that is modulated with the position information. This carrier signal must then be demodulated in order to recover the position information and convert it to an appropriate position signal for use by the position servo. Unfortunately, this process of demodulation and conversion creates numerous avenues through which undesirable dc offset may be introduced into the position signal. What is needed, therefore, is a means to demodulate a servo carrier signal without allowing any such offset to be introduced into the resulting position signal.

Numerous demodulation circuits and demodulating schemes are known in the art. U.S. Pat. Nos. 3,927,378; 3,688,205; 4,250,458; and 4,286,224 are representative. However, none of these references, or any other references known to the inventors, address the problem of reducing the dc offset of a demodulator circuit used in a track-following servo as does the present invention. Nor do any known references show or suggest the particular circuit scheme used by the present invention to achieve its low offset. Further, while prior art is known that relates to track-following servos, such as U.S. Pat. Nos. 3,691,543 and 4,115,823; as well as IBM Technical Disclosure Bulletin, Vol. 21, No. 2, pp. 804–05 (July 1978); and IBM Technical Disclosure Bulletin, Vol. 22, No. 12, pp. 5436–38 (May 1980), this art really does not address the problem of reducing demodulator offset as does the present invention. Rather, the thrust of such art is to disclose a particular encoding scheme that could be used to place the position information on the desired servo tracks. The present invention, in contrast, may be applicable to any type of encoding scheme or demodulation technique (e.g., area detection or peak detection) that may be used.

The problem of demodulator offset has long plagued the industry. The only effective prior art solutions known to the inventors for eliminating or reducing such demodulator offset is to provide manual adjustment means to trim the offset out once the circuit has been built. Alternatively, components may be carefully and manually selected to find matching characteristics. Further, it is known in the art to use a very large number of expensive components, specified for their precise values in the fabrication of such circuits. All of these techniques are undesirable because they are expensive as well as error pron. What is needed, therefore, is a method and technique for eliminating dc offset in demodulator circuits that is both inexpensive and easy to implement.

SUMMARY OF THE INVENTION

It is an object of the present invention to provide an improved demodulator circuit that eliminates undesirable dc offset.

It is a further object of the present invention to provide such a demodulator circuit that may be realized without the use of manual adjustments or selected components.

It is a further object of the present invention to provide such a demodulator circuit that may be readily fabricated using inexpensive, easily obtainable components.

It is also an object of the present invention to provide a low offset position demodulator that is especially adapted for use in a position servo of a disk drive or similar device, thereby improving the accuracy of such positioning servo.

The above and other objects of the invention are realized in a demodulator configuration that employs automatic control system techniques to maintain the operating point of the demodulator at ground potential (zero volts). Doing so advantageously eliminates offset that might otherwise be introduced, for example by temperature, voltage, or component value variations, if other than a zero volt operating point were used. Therefore, the zero volt operating point provides the ideal reference point for the position signal to maintain whenever an "on track" or "at location" condition is present. This is because any offset that might otherwise be introduced in subsequent stages of the demodulation circuit, such as might be caused by component tolerances, is not allowed to be generated so long as the input signal to such subsequent stages is maintained at zero.

In a preferred embodiment of the invention, area detection is employed (although the invention would be just as applicable to other types of detection, such as peak detection). In this preferred embodiment, a gate signal is synchronized with the modulated servo carrier signal using conventional phase lock loop techniques. This synchronized gate signal is then used to switch the servo carrier signal so that within a given period of time there are as many positive peaks within the signal as there are negative peaks for an "on track" condition. Thus, the net area of the demodulated carrier signal, as measured through a low pass filter, is zero for an "on track" condition. However, should an "off track" condition exist, then the net area would be either positive or negative depending upon the direction of the "off track" error. An output buffer filter circuit is also employed in the invention to provide a buffered and smoothed position signal output, having a zero volt value when the desired position has been reached, and a positive or negative value if the desired position has not been reached.

In the preferred embodiment of the invention, the first stage of the demodulator circuit advantageously provides a differential output signal. This first demodulator stage may be considered a "multiplier stage" in that the servo carrier signal is multiplied by the synchronized gate signal (which may be throught of as a −1 or +1 signal), in order to realize the desired switching of the servo carrier signal peaks. The low pass filter coupled to the diffental output of the multiplier stage likewise provides a differential output. An averaging network, coupled to the low pass differential output, averages the signal appearing on one of the two differential signal lines with the signal appearing on the other differential signal line. The resulting average signal is compared to a zero voltage reference signal and the difference between these two signals is used to derive a control voltage that sets the common mode operating point of the multiplier stage. In this fashion, the common mode operating point of the multiplier stage is forced to assume and maintain a zero volt level.

The differential position signal at the output of the low pass filter, in the preferred embodiment, is further fed into a differential-to-signal-ended conversion stage. Once converted to a single ended signal, the signal is appropriately buffered and filtered as described above.

Advantageously, the entire demodulator circuit configuration as above described may be realized using off-the-shelf components which are readily available and inexpensive. Further, there is no requirement for precision regulated power supplies as has been common in the prior art for such circuits.

A further feature of the present invention automatically compensates for duty cycle errors, caused by asymmetric rise and fall times, that might be present in the synchronized gate signal. Elimination or reduction of such errors further improves the accuracy and sensitivity of the demodulator circuit.

BRIEF DESCRIPTION OF THE DRAWINGS

The above and other objects, features, and advantages of the present invention will be more apparent from the following more particular description thereof, presented in connection with the accompanying drawings, wherein.

DETAILED DESCRIPTION OF THE PREFERRED EMBODIMENT

As discussed previously, the present invention relates to demodulator circuits. As is known in the art, demodulator circuits are used for a wide variety of applications. The present invention was conceived in order to address a problem that exists in the positioning servos of disk drive and similar devices. Accordingly, in order to better appreciate and understand the features and advantages of the present invention, it will be helpful to review the operation of a typical disk drive for an understanding of the basic elements thereof.

Figure 1:
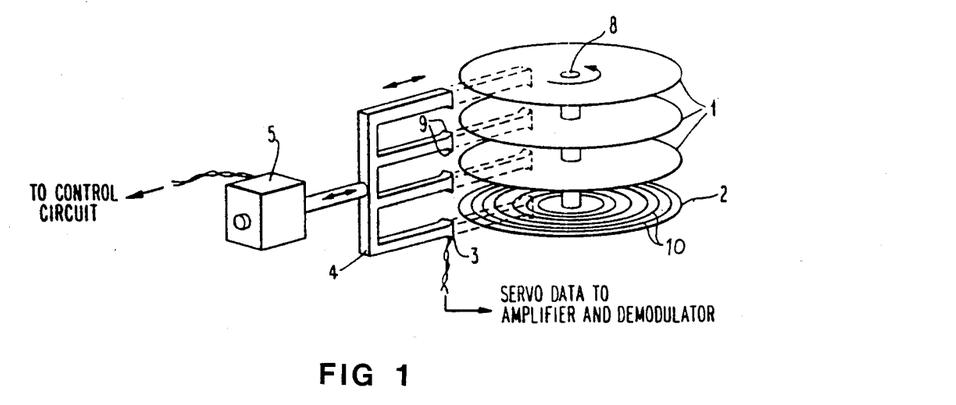
FIG. 1 represents a schematic view of a servo system showing how a head assembly is moved relative to a plurality of disks stacked on a common spindle.

Referring to FIG. 1, a schematic view of a servo system is shown to illustrate how a head assembly 4 is moved relative to a plurality of disks 1. As shown in the FIGURE, a plurality of disk 1 are stacked one on top of the other and attached to a common spindle 8. A servo disk 2 is also connected to the spindle 8. A head assembly 4 may be positioned radially with respect to the disks 1 and 2 by means of a linear positioning device 5. The positioning device 5 responds to control signals from a control circuit that forms part of the position servo. The servo disk 2 has prerecorded thereon a plurality of servo tracks 10. Each track has prerecorded thereon selected position information. A servo read head 3 is adapted to read the information contained in the servo track positioned thereunder. The servo data thus read by the read head 3 is passed on to the appropriate servo system where it is amplified and demodulated.

As explained above, the present invention relates to the demodulation of the servo data in order to provide a position signal that can be used to control the positioning of the linear actuator 5. As the servo read head 3 is moved to a desired track 10 of the servo disk 2, read/write heads 9 are likewise moved to a corresponding track location of the data disks 1. Thus it is seen that the density of the data tracks 10 (that is, how closely the data tracks are placed together) defines the data track density that can be realized on the other disks 1 stacked on the same spindle 8. It has long been an objective of those in the data storage field to achieve as high of data track density as possible. Doing so requires the use of servo track densities that have a correspondingly high track density. Typical servo track widths for disk drives of the type represented in FIG. 1 are on the order of one thousandth of an inch (one mil).

A typical position signal may have a peak value of 5 volts, which would represent a servo head displacement roughly equivalent to one half of the track width. In practice, it is desirable to maintain offsets less than 100 mv, which is equivalent to 10% of the track width. This has not heretofor been an easy feat; and indeed the amount of offset present in a given servo system has represented one of the limiting factors relative to the track density that may be achieved.

Figure 2A:
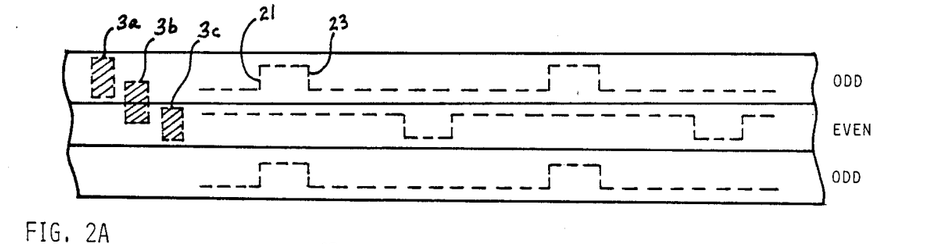
FIG. 2A illustrates a servo track modulation scheme, wherein the modulation scheme repeats itself every two servo tracks.

Referring next to FIG. 2A there is illustrated a typical servo track modulation scheme that is used to place position information on the servo tracks. In the scheme shown, the modulation scheme repeats itself every two servo tracks. That is, the modulation scheme defines odd tracks and even tracks. For an odd track, a positive pulse is recorded at known intervals. This positive pulse is symbolically represented in FIG. 2A as a dashed line. An even track, in contrast, has a negative pulse recorded thereon so as to be positioned midway between the positive pulses of the odd tracks. This pattern repeats itself for as many servo tracks as are employed.

At this point it should be noted that the modulation or encoding scheme shown in FIG. 2A, known to the inventors as di-pulse modulation, is only one of several modulation techniques that could be employed. Other modulation schemes, such as those shown in IBM Technical Disclosure Bulletins Vol. 21, No. 2, pages 804–05 (July 1978); or Vol. 22, No. 12, pages 5436-38 (May 1980) could be employed. The modulation schemes shown in these references repeat every four tracks. Modulation schemes could also be employed, such as are shown in U.S. Pat. No. 3,691,543, wherein positive pulses are used for synchronization and negative pulses are used for positioning information. The present invention will be described in terms of the di-pulse modulation pattern. However, the principles of the present invention could be used with any known, or yet to be conceived, modulation pattern.

Also shown in FIG. 2A are three possible positions that the servo head 3 could assume with respect to the odd/even servo tracks. The servo head 3 could be positioned directly over an odd servo track, as indicated by the dashed area 3a. Similarly, the servo head could be positioned over an even servo track, as indicated by the dashed area 3c. Or, the servo head could be positioned midway between the odd and even track as depicted by the dashed area portion 3b. Of course, there an infinite number of positions that could be assumed by the servo head 3 ranging between the two extremes shown at 3a and 3c.

Figure 2B:
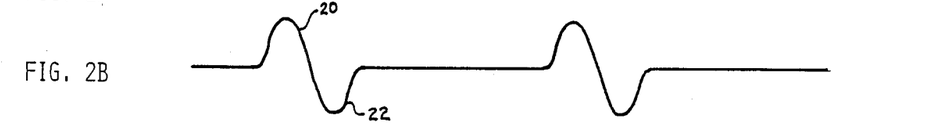
FIG. 2B shows the waveform generated by the servo transducer when the head assembly is positioned over an odd servo track of FIG. 2A.

Referring next to FIG. 2B, there is shown a waveform of the type that would be induced in a magnetic read head 3 in response to having the head positioned over an odd servo track, such as is indicated by the area 3a in FIG. 2A. In FIG. 2B, a positive pulse 20 is induced in the read head 3 as a result of the leading edge 21 (FIG. 2A) of the magnetic pulse recorded on the odd track. Similarly, a negative pulse 22 is induced as a result of the trailing edge 23 (FIG. 2A) of the magnetic pulse. This waveform resembles one cycle of a sine wave.

Figure 2C:
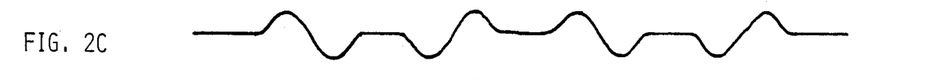
FIG. 2C shows the waveform generated by the servo transducer when the head assembly is positioned equally over both an odd and even servo track.
Figure 2D:
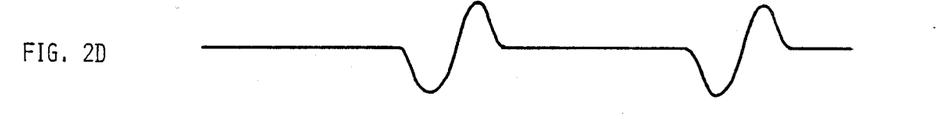
FIG. 2D shows the waveform generated in the servo transducer when the head assembly is positioned over an even track.

FIG. 2D shows how the waveform would appear if the read head were positioned over an even track, and as such corresponds to the signal that would be obtained if the read head were positioned at 3c in FIG. 2A. In like fashion, FIG. 2C shows the waveform that would be generated if the read head were equally spaced over an odd track and an even track, as indicated by the area 3b in FIG. 2A. In this waveform, the overall amplitude has decreased somewhat because only approximately one half of the track is exposed to the read head. However, magnetic flux transitions from both the odd and even tracks are picked up by the read head. As will be evident from the description that follows, it is this between-tracks position, i.e., the location indicated by 3b in FIG. 2A, that defines an "on track" condition for purposes of reading and writing data. That is, it is the boundary between an odd and even servo track that determines where a particular data track will be located.

Figure 3:
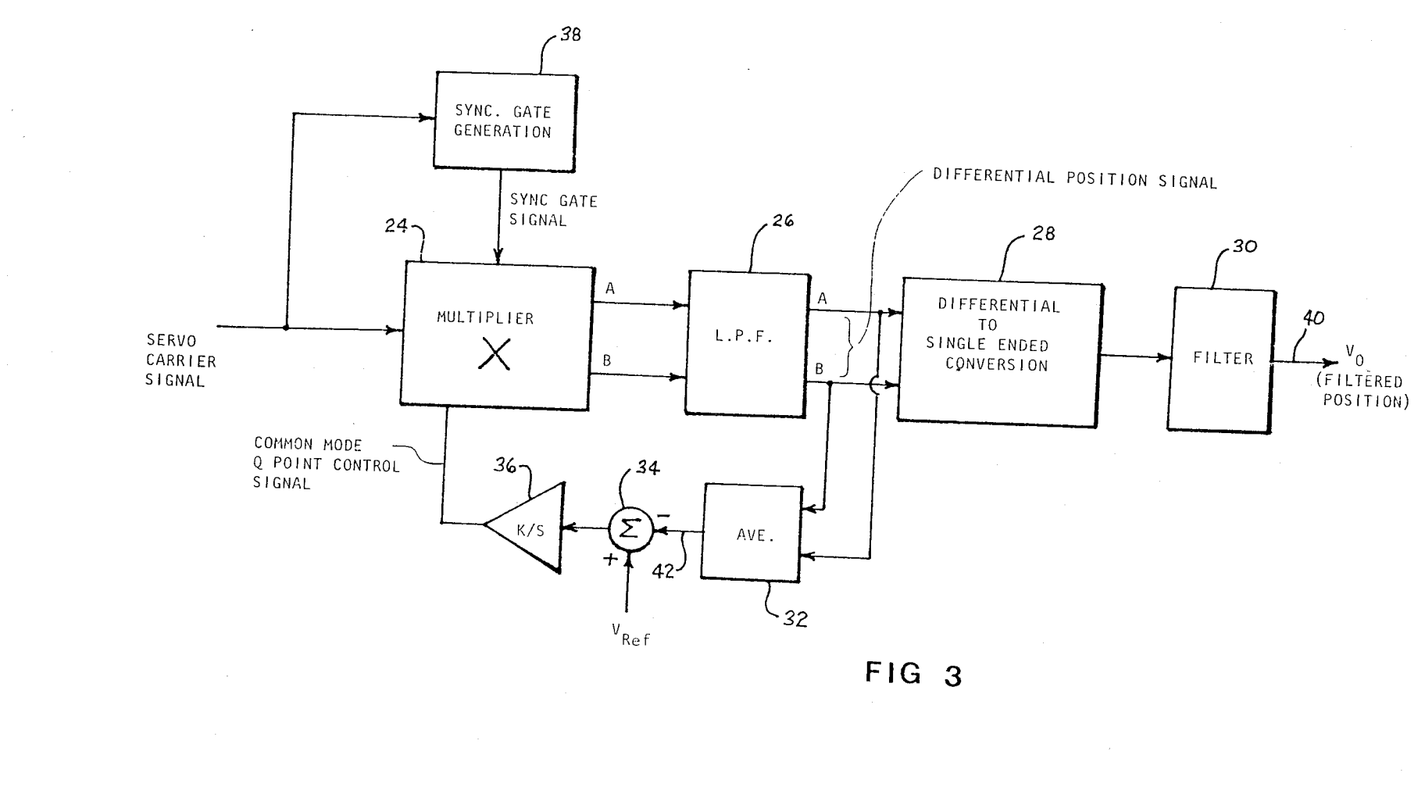
FIG. 3 is a block diagram of a low offset position demodulator according to the present invention.

Referring next to FIG. 3 there is shown a block diagram of a preferred embodiment of the demodulation configuration of the present invention. The forward path of this configuration includes a multiplier circuit 24 (sometimes referred to as a "switching circuit" for reasons that will be apparent below), a low pass filter 26, a differential to single ended conversion stage 28, and a filter circuit 30. An averaging circuit 32 is coupled to the output of the low pass filter 26. The output of the averaging circuit 32 is compared to a reference signal, $V_{Ref}$, at the summing point 34, and the output thereof is integrated (averaged over time) by the integrator circuit 36. The output of the integrator 36 is used as a control voltage to control the common mode quiesent operating point (Q point) of the multiplier circuit 24. Synchronous gate generation circuitry 38 is employed to generate a gate signal that is synchronized with the servo carrier signal. It is noted that in the preferred embodiment both the multiplier circuit 24 and the low pass filter 26 are differential mode devices. That is, the output of the multiplier 24 appears on both the A and B output signal lines, the signal appearing on line B being the inverse of the signal appearing on line A (when measured with respect to ground).

The operation of the circuit shown in FIG. 3 will now be explained in conjunction with the timing diagrams of FIGS. 4A–4C. Referring first to FIG. 4B, which represents an "on track" condition, it is seen that the servo carrier signal appears as was described previously in connection with FIG. 2C. From this carrier signal a synchronized gate signal is generated by the synchronous gate generation circuitry 38. This circuitry may be a conventional phase locked loop, the operation and construction of which is well described in the art. It is noted that the gate signal is synchronized with the servo carrier signal such that the same edge (the trailing edge in FIGS. 4A–4C, although the leading edge could likewise be used) is aligned with the zero crossings of the servo carrier signal.

The multiplier circuit 24 multiplies or switches the servo carrier signal so that the output thereof is as depicted in FIG. 4B. At the A output, positive and negative half cycles of the servo carrier signal appear whenever the gate signal is high. Whenever the gate signal is low, however, positive and negative half cycles of the servo carrier signal are inverted. Thus, if a high gate signal is thought of as a $+1$, and a low gate signal is thought of as a $-1$, the output of the multiplier circuit becomes merely the servo carrier signal multiplied by the gate signal, which output may be thought of as a product signal. The signal appearing on the B output of the multiplier circuit 24 is the inverse of that appearing on the A output.

Both the A and B outputs of the multiplier circuit 24 are directed to the low pass filter 26. A low pass filter has the characteristic of determining the net area, positive or negative, associated with a signal having a high frequency appearing at its input. In the case of FIG. 4B, which represents the "on track" condition, it is seen that the positive half cycles are equal to the negative half cycles. Thus, the output appearing at the respective low pass filter output is zero volts. A similar situation exits for the B output of the low pass filter.

Figure 4A:
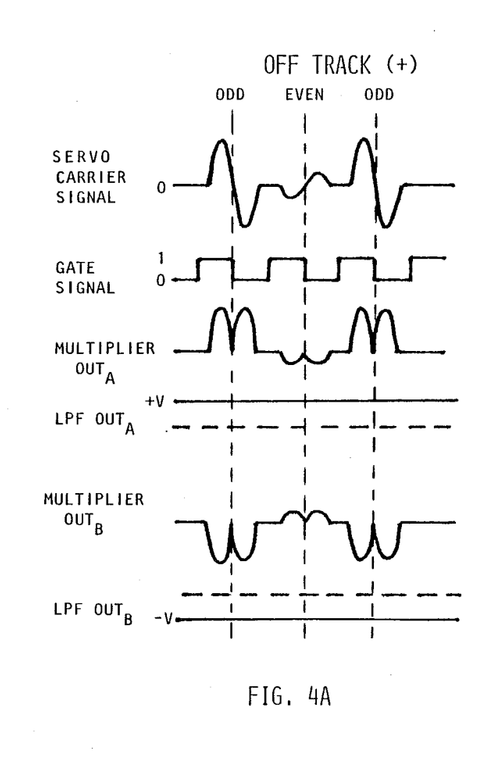
FIGS. 4A–4C show relevant waveforms and timing relationships associated with the operation of the circuit of FIG. 3.
Figure 4B:
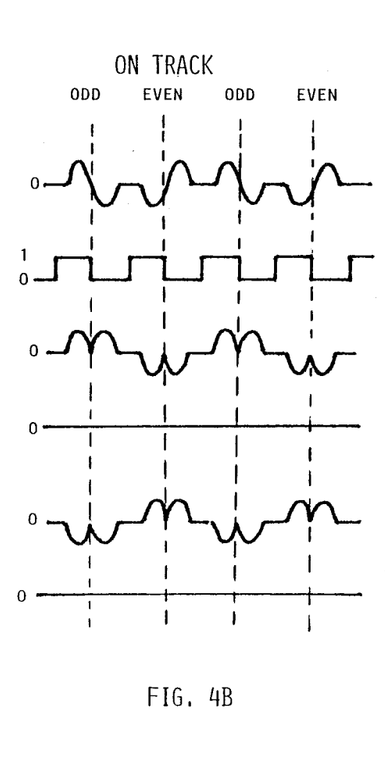

Should the read head 3 begin to drift away from the "on track" condition, so that the head is more over an "odd" servo track than an "even" servo track, than the signals would appear as shown in FIG. 4A. In FIG. 4A, the net area of the "switched pulses" appearing on the A output of the multiplier circuit 24 is positive, while the net area of the pulses appearing on the B output is negative. Accordingly, the A and B outputs of the low pass filter are positive and negative respectively. These signals are converted to a single signal by means of the differential to single ended conversion circuitry 28 (FIG. 3), filtered by the filter circuit 30, and presented as an output voltage $V_0$, at the output line 40. If the position servo is operable, this position signal, $V_0$, is used as an error signal to force the read head 3 back over the boundary between the "odd" and "even" tracks.

Figure 4C:
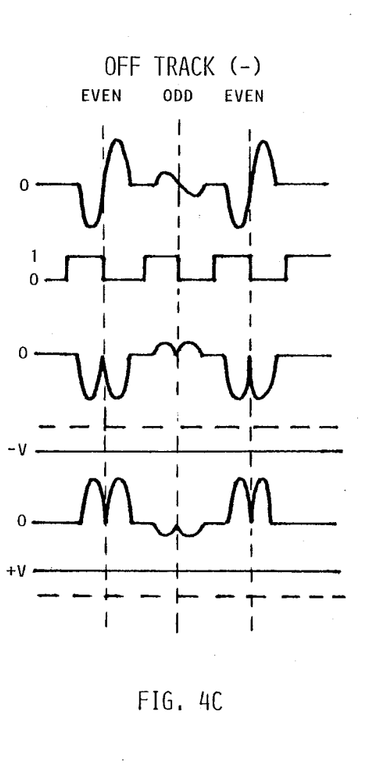

In a similar fashion, FIG. 4C depicts the signal waveforms that would exist for a condition where the read head begins to drift more over an "even" servo track than the "odd" servo track. Here, the result is that the signal $V_0$ would have a different polarity from that associated with FIG. 4A. Thus the position signal $V_0$ not only indicates that an "off track" condition exists, it also indicates the direction of the "off track" condition.

From the above description, and as will be explained more fully below, it is evident that common mode offset signals—that is, offset signals that have the same polarity in both the A and B output lines—may be transferred, and even amplified, through the conversion circuitry 28 to appear in the position signal $V_0$. To eliminate such common mode offset, and thereby preclude any such offset from finding its way to the position signal $V_0$, the common mode Q point of the multiplier circuit output 24 is forced to a zero volt level. This is achieved through the use of the averaging circuit 32, which averages the offset appearing on the B output of the low pass filter with the offset appearing on the A output. Differential offset is, of course, cancelled in this averaging circuit. However, common mode offset would appear as a positive or negative voltage on the signal line 42. This signal is compared to a reference voltage, $V_{Ref}$, and the difference is integrated by the integration circuit 36 and used as a control signal to control the common mode Q point of the multiplier circuit 24.

As indicated earlier, the reference voltage $V_{Ref}$, is selected to be zero volts or ground potential. Doing so forces the common mode Q point of the multiplier circuit 24 to also be zero volts. Using a zero volt operating point in this fashion provides significant advantages over using other reference levels. In the first place, the reference voltage $V_{Ref}$, being ground, does not have to depend upon a precision voltage supply. Further, and more significantly, any mismatch that may exist in the components or operation of the conversion circuitry 28 (which mismatch could otherwise cause a slight offset at the output of the low pass filter 26 to be transferred to the position signal $V_0$) has no effect so long as the input signal thereto has a common mode offset of zero. This is because any gain factor of the conversion circuit times zero still remains zero. Moreover, any condition within the multiplier circuit 24 or the low pass filter 26 that might otherwise tend to contribute to offset, is in effect cancelled out because of the feedback scheme shown.

It is noted that while the analysis of the operation of the circuits shown in the block diagram of FIG. 3 and FIGS. 4A–4C is based on area detection—that is comparing the positive areas of the switched or multiplied waveform the the negative areas—it would also be possible to use a feedback scheme as shown in FIG. 3 with respect to a peak detection demodulation system. In a peak detection system, some sort of sample and hold network is typically employed in order to determine the peak value of the detected servo carrier signal. This peak value is then compared to a reference level so that a determination can be made as to whether the proper peak amplititude has been achieved or not. If not, then an "off track" condition is present. If the expected level is obtained, an "on track" condition is present. In such a system, it is still necessary to reduce offset so that the peak value detected will be accurate. A feedback scheme similar to that shown in FIG. 3 wherein the operating point of the detection circuit is forced to zero volts could advantageously be used for this purpose.

Figure 5:
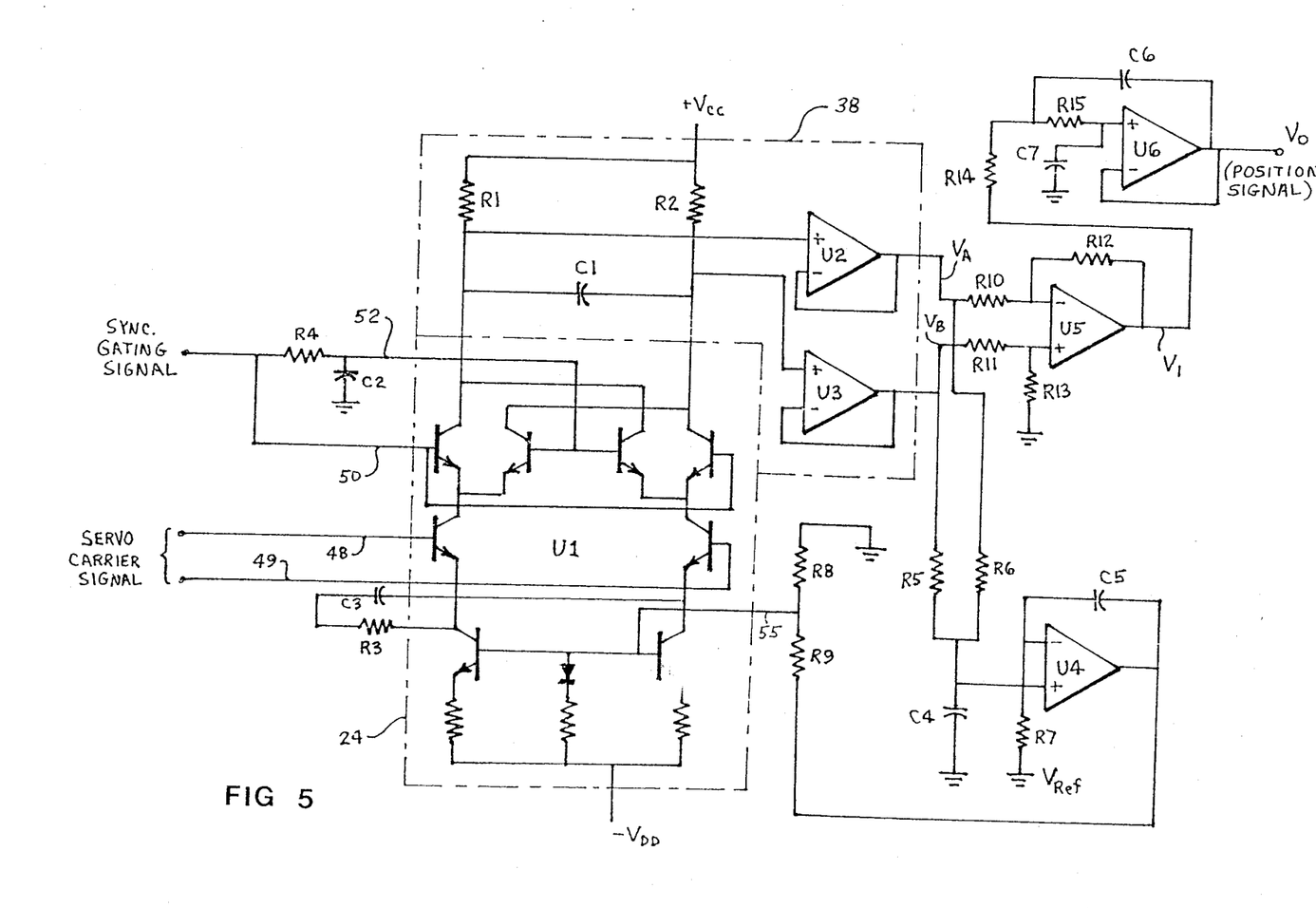
FIG. 5 is a schematic diagram of a preferred embodiment of the position demodulator circuit of FIG. 3.

Referring next to FIG. 5, there is shown a schematic diagram of the preferred embodiment of the present invention. The multiplier circuit 24 may be realized with a single integrated circuit U1. The integrated circuit U1 is a balanced demodulator circuit, such as an MC1496 manufactured by Motorola. A di-pulse carrier servo signal is applied to the differential input signal lines 48 and 49 of U1.

Figure 6A:
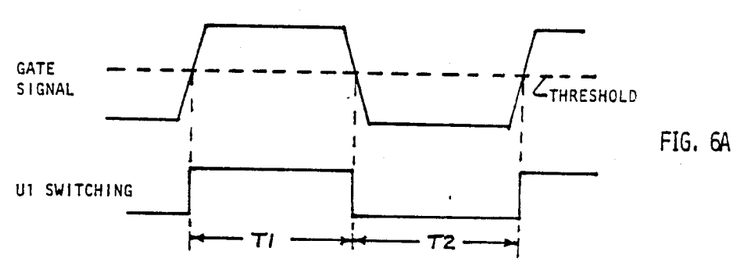
FIG. 6 is a timing diagram depecting the effect of R4 and C2 on the operation of the circuit of FIG. 5.
Figure 6B:
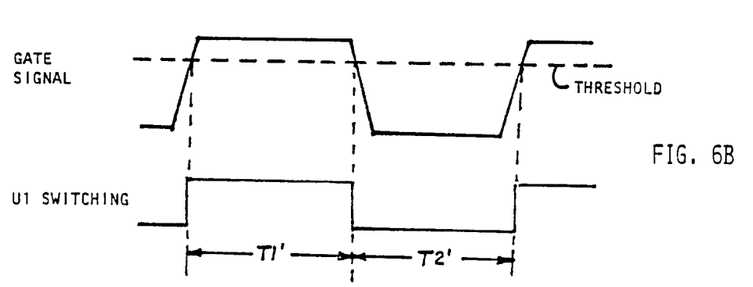

A synchronous gating signal, having approximately a 50% duty cycle, is applied to one of the switching inputs 50 of U1. The other switching input 52 is applied to a reference voltage created by the circuit R4 and C2. This reference voltage acts as a threshold voltage that determines when the internal switching of U1 occurs. Advantageously, this threshold voltage self adjusts to the center of the gating waveform. This self adjustment prevents switching duty cycle error due to drifting dc gating signal level and finite rise and fall times. The effect of this circuit is illustrated in FIG. 6. In FIG. 6A, a truly symmetrical gating signal is applied to the R4-C2 network. This network acts as the low pass filter and generates a threshold voltage that is a function of the duty cycle. Thus, for a 50% duty cycle signal, the threshold voltage, indicated by the dashed line in FIG. 6, is midway between the high and low levels of the gate signal. This causes the switching within U1 to occur as indicated by the U1 switching signal, wherein the time T1 is equal to the time T2. In FIG. 6B, a gating signal having a duty cycle error is shown. This particular error has a positive half cycle slightly wider than the negative half cycle. Because of this imbalance, the threshold level rises as shown causing the U1 switching points to occur as indicated, with T1' still being approximately equal to T2'. Thus, the duty cycle error in the gate signal is corrected as far as the U1 switching function is concerned.

Referring back to FIG. 5, it is seen that the two resistors R1 and R2, in combination with the capacitor C1, form the output filter network for U1, or the low pass filter 38. R1 and R2 should be matched in ratio to minimize offset. These two resistors are the only two critical components in the circuit of FIG. 5. Because they are resistors, they may be readily secured in a suitable resistor pack that is laser trimmed, thereby guaranteeing the values and matching thereof.

The amplifiers U2 and U3 buffer R1 and R2 such that the input current to U5 and its associated components do not cause an offset voltage to appear across R1 and R2. The circuits U2 and U3 are preferrably low input bias current amplifiers, such as the LF412 operational amplifier manufactured by National Semiconductor. The LF412 amplifier advantageously has a field effect transistor (FET) input, which guarantees very high input impedance and low bias current.

The averaging network 32 and summing point 34 and integrating circuit 36 of FIG. 3, are realized in FIG. 5 by R5, R6, R7, C4, C5, and U4. R5 and R6 monitor the common mode voltage of the demodulator U1 through the buffer amplifiers U2 and U3. The output of the integrator U4 is divided down by R8 and R9 to limit the range of common mode output voltages available from U1. This output is then connected to the control line 55 of U1, which control line sets the reference voltage that determines the current flowing in each leg of the demodulator circuit U1. Thus, by controlling the voltage on line 55, the quiesent operating point, or Q point, of each leg of the integrated circuit U1 can be controlled. The reference voltage $V_{Ref}$ of FIG. 3 is selected to be zero volts. This zero volt reference is directed to U4 through the resistor R7. The control loop comprised of R5, R6, R7, R8, R9, C4, C5, and U4 thus forces the common mode voltage of U2 and U3 to be equal to zero. By so doing, any offset that might otherwise be created in the differential to single ended conversion stage comprised of R10, R11, R12, R13, and U5 is of no concern.

To illustrate the above, the following analysis is provided. If an "on track" condition exists, then the voltage $V_A$ at the output of U2, will equal the voltage $V_B$, at the output of U3. The output of the amplifier U5, $V_1$, is therefore $$V_1 = V_A \times (\text{non-inverting gain}) - V_B \times (\text{inverting gain}) \quad (1)$$

or $$V_1 = V_A \left( \frac{R13}{R11 + R13} \right) \left( \frac{R12 + R10}{R10} \right) - V_B \left( \frac{R12}{R10} \right) \quad (2)$$

Assuming 1% resistors are used, and assuming a common mode voltage $V_A = V_B$ could reach as high as 10 volts, an offset of 200 mv could be generated under a worse case condition, as illustrated by equation (3) below. If this common mode voltage is forced to zero, as is the case where the present invention is used, then this offset would not exist. That is, zero volts times the non-inverting gain minus the inverting gain still remains zero volts.

$$V_1 = 10 \left( \frac{1.01}{1.01 + .99} \right) \left( \frac{.99 + 1.01}{1.01} \right) - \quad (3)$$

$$10 \left( \frac{.99}{1.01} \right) = 200 \text{ mv}$$

The final stage of the demodulator is a filter network comprised of the integrated circuit U6, the resistors R14 and R15, and capacitors C6 and C7. Because this circuit has a dc gain of 1.0, it contributes very little offset.

Advantageously, all of the integrated circuits U2, U3, U4, U5, and U6 may be realized using the LF412 operational amplifier manufactured by National Semiconductor. Thus, the circuit offers the advantage of common parts. Moreover, the remaining components in the circuit are off-the-shelf components that are relatively inexpensive and easy to obtain. No adjustable components or specially card test selected components need be used in the invention, yet a very low dc offset is obtained.

In practice, implementation of the above-described low offset position demodulator circuit has resulted in at least a four times improvement in the position signal offset that is present. Prior to implementation of the present invention, an offset of at least 400 mv could be anticipated. In contrast, implementation of the present invention has reduced that level to less than 100 mv. Such reduction has a direct impact upon improving the position servo accuracy of the disk drive, thereby allowing greater track density than has heretofor been possible.

While the present invention has been described by means of a particular embodiment thereof for use in a particular application—disk drives—it is understood that many variations and modifications of the present invention, as well as different applications thereof, will be apparent to those skilled in the art. Accordingly, the scope of the present invention is not intended to be limited to the particular embodiment and applications described, but is to be ascertained by a reference to the following claims.

What is claimed is:

1. A low offset position demodulator for providing, in response to a servo carrier signal, a position signal that indicates the radial position of a head assembly with respect to a given track boundary between adjacent tracks of a rotating disk, said tracks on said disk having information selectively encoded thereon that distinguishes at least every other track, the head assembly providing the servo carrier signal in response to reading the encoded information from at least one of said tracks, said position demodulator comprising:

means for generating a gate signal synchronized with selected transistions of said servo carrier signal;

means for multiplying said servo carrier signal by said gate signal, thereby generating a product signal;

means for determining whether said product signal represents an "On Track" condition, indicating a desired radial position of said head assembly with respect to a selected track boundary, or an "Off Track" condition, indicating a non-desired radial position of said head assembly with respect to said selected track boundary;

means for maintaining the offset of said product signal at a prescribed level; and conversion means for converting the findings of said determining means to said position signal, said position signal assuming a known value in response to an "On Track" condition.

2. The position demodulator as defined in claim 1 wherein said offset maintaining means comprises feedback means coupled between said determining means and multiplier means for maintaining the quiescent operating point of said multiplier means at a prescribed level.

3. The position demodulator as defined in claim 2 wherein the prescribed level of the quiescent operating point of said multiplier means is zero.

4. The position demodulator as defined in claim 3 wherein said determining means includes means for comparing the area included under a first selected portion of the product signal waveform to the area included under a second selected portion of the product signal waveform, the first portion of the waveform corresponding to that waveform generated as a result of encoded information in a first track of said disk, and the second portion of the waveform corresponding to that waveform generated as a result of encoded information in a second track of said disk, said second track being adjacent to said first track.

5. The position demodulator as defined in claim 3 wherein said determining means includes pulse detection means for comparing a pulse signal of a first selected portion of the product signal waveform to a pulse signal of a second selected portion of the product signal waveform, the first portion of the waveform corresponding to that waveform generated as a result of encoded information in a first track of said disk, and the second problem of the waveform corresponding to that waveform generated as a result of encoded information in a second track of said disk, said second track being adjacent to said first track.

6. The position demodulator as defined in claim 4 wherein said multiplier means includes a differential output stage, whereby said product signal appears differentially on a pair of output signal lines at the output of said multiplier means.

7. The position demodulator as defined in claim 6 wherein said comparison means comprises a low pass filter having a differential output, whereby the signal at said differential output is zero for an "On Track" condition, and non-zero of one polarity for an "Off Track" condition in one direction, and non-zero of the other polarity for an "Off Track" condition in the other direction.

8. The position demodulator as defined in claim 7 wherein said low pass filter includes a pair of high input impedance buffer amplifiers as output buffer amplifiers of said filter.

9. The position demodulator as defined in claim 7 wherein said multiplier means includes control means for setting the common mode quiesent operating point thereof by means of an external control voltage applied thereto.

10. The position demodulator as defined in claim 9 wherein said feedback means comprises:

an averaging circuit for averaging the product signals appearing on each output of said low pass filter and generating an output signal equal to the average thereof;

a comparison circuit for comparing the output of said averaging circuit with a reference voltage and providing a difference signal indicative of the difference, if any, therebetween;

time averaging means for monitoring said difference signal over time and generating a control signal equal to the time average thereof; and means for coupling said control signal to the control means of said multiplier means.

11. The position demodulator as defined in claim 10 wherein said multiplier means is realized by a balanced demodulator integrated circuit chip.

12. The position demodulator as defined in claim 7 wherein said conversion means comprises a Differential-to-Single-Ended Conversion circuit.

13. The position demodulator as defined in claim 3 further including gate signal duty-cycle compensation means for automatically correcting duty cycle errors appearing in said gate signal as said gate signal is applied to said multiplier means.

14. An improved demodulator circuit that eliminates undesirable dc offset, said demodulator circuit comprising:

a balanced demodulator circuit including:
  differential input signal lines to which a modulated carrier signal may be connected,
  differential output signal lines from which a demodulated carrier signal may be recovered, at least one switching input signal line to which a switching gate signal for use in the demodulation process may be connected, and
  a control line to which a control voltage may be connected in order to set the desired common mode quiesent operating point within said balanced demodulator circuit;

a low pass filter coupled to the differential output signal lines of said balanced demodulator circuit, said low pass filter also having differential output signal lines;

feedback means for averaging the signals appearing at the output signal lines of said low pass filter, comparing the resultant averaged signal to a reference signal, and coupling a signal representing the difference between said averaged signal and said reference signal to the control line of said balanced demodulator circuit; and a differential-to-single-ended conversion circuit coupled to the output signal lines of said low pass filter, said conversion circuit thereby providing a single output signal line upon which an output signal representative of the information contained in said modulated carrier signal may be recovered.

15. The improved demodulator circuit of claim 14 wherein the reference voltage of the feedback means is selected to be zero volts, whereby the common mode quiesent operating point of said balanced demodulator circuit is maintained at zero volts.

16. The improved demodulator circuit as defined in claim 15 further including compensation means for correcting certain duty cycle errors appearing in the gate signal connected to the switching input signal line of the balanced demodulator circuit.

17. The circuit as defined in claim 16 wherein said compensation means comprises a threshold voltage generating circuit, said circuit being designed to generate a threshold voltage for use by said balanced demodulator circuit that self adjusts to the center of the gate signal.

18. The circuit as defined in claim 15 wherein said low pass filter includes buffer output amplifiers, one connected to each of the two differential output signal lines, each of said buffer output amplifiers having a very high impedance input stage.

19. The circuit as defined in claim 15 wherein said feedback means includes an integrating circuit for integrating the difference between the average signal and the zero voltage reference signal.

20. In a disk drive having a head that may be positioned radially with respect to a rotating disk under control of a positioning servo, a method for reducing the offset associated with a position demodulator used within said servo, said position demodulator being adapted to generate a position output signal that represents the relative location of said head with respect to servo tracks previously placed on said disk, said method comprising the steps of:
 (a) modulating a carrier signal with position information that indicates whether an "On Track" or "Off Track" condition exists, an "On Track" condition meaning that the head is positioned as desired with respect to the servo tracks, and an "Off Track" condition meaning that the head is not positioned as desired with respect to said tracks; and
 (b) demodulating the carrier signal to recover the position information by
  (1) generating a gate signal synchronized with selected transitions of said modulated carrier signal,
  (2) multiplying the modulated carrier signal by the gate signal to form a product signal;
  (3) analyzing the product signal to determine: (a) whether an "On Track" or "Off Track" condition is indicated, and (b) whether undesirable dc offset is present therein,
  (4) using automatic control system techniques to force and maintain any undesirable dc offset present within the product signal to zero, and
  (5) converting the On Track/Off Track information contained within said product signal to said position output signal, said position ouptut signal having a zero level for an "On Track" condition, a positive level for an "Off Track" condition in one direction, and a negative level for an "Off Track" condition in the other direction.

21. The method of claim 20 wherein step (b)(3) comprises:
 (i) splitting the product signal into a differential signal;
 (ii) monitoring the differential value of said product signal to determine the On Track/Off Track information; and
 (iii) monitoring the common mode operating point of said product signal to determine if any offset is present therein.

22. The method of claim 21 wherein step (b)(3)(iii) comprises:
 (1) averaging the product signal appearing on one of the two differential signal lines with the product signal appearing on the other differential signal line;
 (2) comparing the average value signal thus obtained to a zero volt reference signal; and
 (3) applying the difference, if any, between the average value signal and the zero volt reference signal to feedback means that controls the location of the common mode operating point of the product signal, thereby forcing said operating point to assume and maintain a zero volt level.

* * * * *